United States Patent
Hirose et al.

(10) Patent No.: US 9,460,910 B2
(45) Date of Patent: Oct. 4, 2016

(54) LAMINATION METHOD AND LAMINATION SYSTEM

(71) Applicant: KABUSHIKI KAISHA MEIKI SEISAKUSHO, Ohbu-shi, Aichi (JP)

(72) Inventors: Tomoaki Hirose, Ohbu (JP); Atsushi Okano, Nagoya (JP); Hisanaga Tajima, Inazawa (JP); Takayuki Yamamoto, Tokoname (JP)

(73) Assignee: KABUSHIKI KAISHA MEIKI SEISAKUSHO, Ohbu-Shi (JP)

( * ) Notice: Subject to any disclaimer, the term of this patent is extended or adjusted under 35 U.S.C. 154(b) by 268 days.

(21) Appl. No.: 13/972,338

(22) Filed: Aug. 21, 2013

(65) Prior Publication Data

US 2014/0053974 A1 Feb. 27, 2014

(30) Foreign Application Priority Data

Aug. 24, 2012 (JP) .................. 2012-184884

(51) Int. Cl.
| | |
|---|---|
| H01L 21/02 | (2006.01) |
| H01L 21/67 | (2006.01) |
| B32B 37/10 | (2006.01) |

(52) U.S. Cl.
CPC ..... *H01L 21/02104* (2013.01); *B32B 37/1009* (2013.01); *H01L 21/67132* (2013.01); *B32B 2309/105* (2013.01); *B32B 2457/14* (2013.01); *Y10T 156/17* (2015.01)

(58) Field of Classification Search
CPC .......... B32B 2457/14; B32B 37/1009; H01L 21/67132
USPC ................................ 156/285, 381
See application file for complete search history.

(56) References Cited

U.S. PATENT DOCUMENTS

| 4,447,201 A | * | 5/1984 | Knudsen | B29C 43/12 264/314 |
|---|---|---|---|---|
| 5,593,532 A | * | 1/1997 | Falk | B32B 17/10788 136/251 |
| 6,092,578 A | * | 7/2000 | Machida | B29C 43/56 156/358 |
| 6,367,530 B1 | | 4/2002 | Shimotomai | |
| 2008/0038903 A1 | * | 2/2008 | Yamamoto | B24B 37/30 438/464 |
| 2010/0243147 A1 | * | 9/2010 | Matsui | B32B 37/10 156/250 |
| 2011/0120641 A1 | * | 5/2011 | Yamamoto | H01L 21/67132 156/285 |

FOREIGN PATENT DOCUMENTS

| JP | H08-500214 A | 1/1996 |
|---|---|---|
| JP | 2000-082833 A | 3/2000 |
| JP | A-2005-340335 | 12/2005 |
| JP | A-2009-259924 | 11/2009 |
| JP | 2010-021472 A | 1/2010 |
| JP | 2011-109008 A | 6/2011 |
| JP | A-2012-104782 | 5/2012 |

* cited by examiner

*Primary Examiner* — Christopher Schatz
(74) *Attorney, Agent, or Firm* — Oliff PLC

(57) ABSTRACT

To provide a lamination method and a lamination system capable of excellently laminating a film-type laminate without damage even though the semiconductor is a brittle lamination target such as a foil-type semiconductor or a semiconductor made of highly brittle material. In a lamination method for laminating a film-type laminate to a brittle lamination target by overlapping the brittle lamination target and the film-type laminate and heating and pressing the brittle lamination target and the film-type laminate, with respect to the brittle lamination target mounted on a mount member and carried into a lamination device, an elastic film member is expanded into a vacuum chamber of the lamination device from the above to press and laminate the brittle lamination target and the film-type laminate.

4 Claims, 8 Drawing Sheets

LAMINATION METHOD AND LAMINATION SYSTEM

TECHNICAL FIELD

The present invention relates to a lamination method and a lamination system, and more particularly, to a lamination method and a lamination system for laminating a film-type laminate on a brittle lamination target which is loaded on and carried by a mount member.

BACKGROUND ART

When a film such as an NCF film is laminated on a lamination target such as a semiconductor wafer, a lamination device using a roll as disclosed in Patent Literature 1 has been used. Even if a lamination target has a small thickness, multiple lamination targets having flexibility may be successively laminated to increase thickness. However, in general, a lamination target and a film are mounted on a carrier film and carried into a lamination device to be laminated. In this method, it is necessary to contact the lamination target (such as a semiconductor wafer) with a human hand or a carrier robot in order to mount or remove the lamination target from the carrier film.

Recently, a semiconductor wafer having a thickness of 0.3 mm or less or a wafer using brittle material made of a compound such as gallium nitride have been used. Such wafers may be easily damaged by contact when the semiconductor wafer is mounted on a carrier film before lamination ("mounting") or when the laminated semiconductor wafer is carried out of the lamination device on the carrier film ("carrying out"). In addition, in the lamination device using a roll, a pressure is applied as a linear load during laminating and is thus only partially applied to the semiconductor wafer. The wafer may therefore be easily broken, similar to when mounting or carrying out the wafer on the carrier film. In addition, the upper surface of the semiconductor wafer may include a protrusion, such as a bump. If lamination is performed using a roll, a force is applied to the bump or the like in the lateral direction, and therefore the bump or the like may collapse.

Therefore, as disclosed in Patent Literature 2 and Patent Literature 3, a film-type laminate is also laminated on a semiconductor wafer using a lamination device having a pressing film member which is an elastic body. If this lamination device is used, the semiconductor wafer may be substantially uniformly pressed by the pressing film member, rather than linearly pressed as in the lamination device using a roll. In addition, since the lamination device having the pressing film member may substantially uniformly press a semiconductor wafer from above even when the semiconductor wafer has a protrusion such as a bump, the protrusion such as a bump does not easily collapse during the pressing performed by a roll.

However, in Patent Literature 2, since the semiconductor wafer is directly mounted on a carrier film and carried into the lamination device having a pressing film member, it is necessary to directly contact the semiconductor wafer when mounting the semiconductor wafer onto the carrier film or when carrying the semiconductor wafer out of the lamination device on the carrier film after lamination. In addition, Patent Literature 3 does not disclose how a semiconductor wafer is carried into or out of the lamination device having a pressing film member.

RELATED LITERATURES

Patent Literature

Japanese Patent Application Publication No. 2005-340335

Japanese Patent Application Publication No. 2012-104782

Japanese Patent Application Publication No. 2009-259924

DISCLOSURE

Technical Problem

As described above, in Patent Literature 1 to Patent Literature 3, when mounting a lamination target such as a semiconductor wafer onto a carrier film or carrying the lamination target out of the lamination device on the carrier film, it is necessary to directly contact the semiconductor wafer with a human hand or a carrier robot. However, in the case of laminating a brittle lamination target (such as a foil-type semiconductor or a semiconductor made of highly brittle material), a lamination method or a lamination system has not been established that ensures good lamination of a film-type laminate without damaging the brittle lamination target when carrying the laminate into a lamination device, laminating the laminate in the lamination device and carrying the laminate out from the lamination device.

The present invention is designed in consideration of the above problems, and the present invention is directed to providing a lamination method and a lamination system that favorably laminate a film-type laminate without causing damage even though the film-type laminate is a brittle lamination target such as a foil-type semiconductor or a semiconductor made of highly brittle material.

Technical Solution

A lamination method of the disclosed embodiments laminates a film-type laminate on a brittle lamination target by layering the brittle lamination target and the film-type laminate and heating and pressing the brittle lamination target and the film-type laminate. With respect to the brittle lamination target mounted on a mount member and carried into a lamination device, an elastic film member is expanded into a vacuum chamber of the lamination device from above to press and laminate the brittle lamination target and the film-type laminate.

The mount member may include a wafer ring having a rim shape and a dicing tape adhered to the wafer ring.

The wafer ring having a rim shape may have a thickness that is larger than the sum of thicknesses of the brittle lamination target and the film-type laminate.

The brittle lamination target may be carried into or out of the lamination device by supporting the wafer ring of the mount member.

The mount member on which the brittle lamination target and the film-type laminate are mounted may be carried into or out of the lamination device by using a carrier film.

A lamination system of the disclosed embodiments laminates a film-type laminate on a brittle lamination target by layering the brittle lamination target and the film-type laminate and heating and pressing the brittle lamination target and the film-type laminate. The lamination system includes a lamination device having an upper plate, a lower plate capable of forming a vacuum chamber between the upper plate and the lower plate, and an elastic film member installed onto the upper plate and expandable into the vacuum chamber. The lamination system also includes a mount member to be carried into or out of the lamination device in a state where the brittle lamination target is mounted thereto.

The mount member may include a wafer ring having a rim shape and a dicing tape adhered to the wafer ring.

Advantageous Effects

The lamination method of the disclosed embodiments laminates a film-type laminate on a brittle lamination target by layering the brittle lamination target and the film-type laminate and heating and pressing the brittle lamination target and the film-type laminate. With respect to the brittle lamination target mounted on a mount member and carried into a lamination device, an elastic film member is expanded into a vacuum chamber of the lamination device from above to press and laminate the brittle lamination target and the film-type laminate. Therefore, since the brittle lamination target is not damaged during a carrying-in process, a carrying-out process and a laminating process, a yield may be enhanced when the film-type laminate is laminated on the brittle lamination target.

The lamination system of the disclosed embodiments laminates a film-type laminate on a brittle lamination target by layering the brittle lamination target and the film-type laminate and heating and pressing the brittle lamination target and the film-type laminate. The lamination system includes a lamination device having an upper plate, a lower plate capable of forming a vacuum chamber between the upper plate and the lower plate, and an elastic film member installed onto the upper plate and expandable into the vacuum chamber. The lamination system also includes a mount member to be carried into or out of the lamination device in a state where the brittle lamination target is mounted thereto. Therefore, since the brittle lamination target is not damaged during a carrying-in process, a carrying-out process and a laminating process, a yield may be enhanced when the film-type laminate is laminated on the brittle lamination target.

BEST MODE

A lamination system 11 according to an embodiment will be described with reference to FIG. 1 or 3. The lamination system 11 of this embodiment laminates a film-type laminate F on a semiconductor wafer W by layering the semiconductor wafer W, which is a brittle lamination target, and the film-type laminate F and heating and pressing the semiconductor wafer W and the film-type laminate F. The lamination system 11 includes a lamination device 12 for laminating the semiconductor wafer W and the film-type laminate F, and a carrying mechanism 13 for carrying the semiconductor wafer W and the film-type laminate F, or the like.

Figure 1:
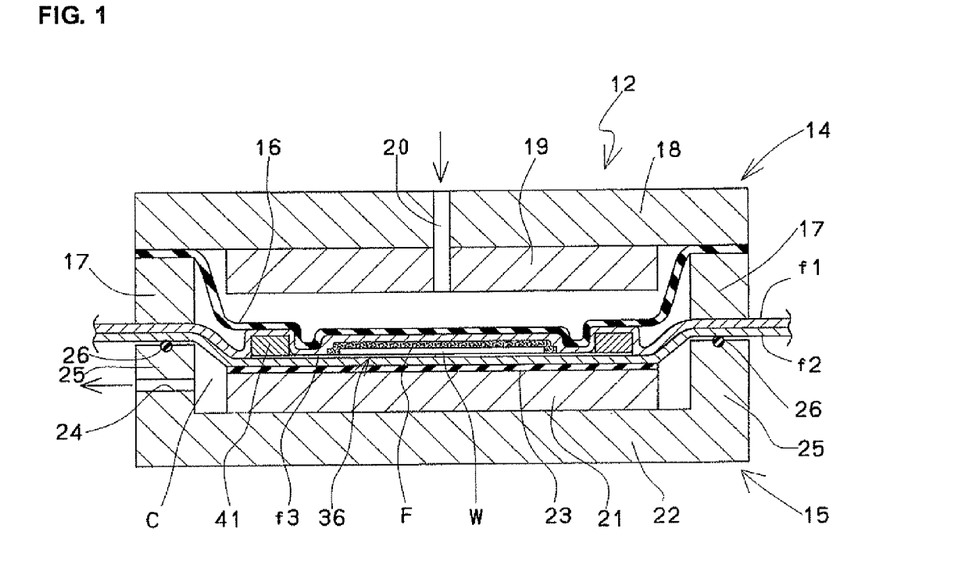
FIG. 1 is a diagram showing a lamination device when a vacuum chamber is closed and a semiconductor wafer is pressed by an elastic film member.
Figure 2:
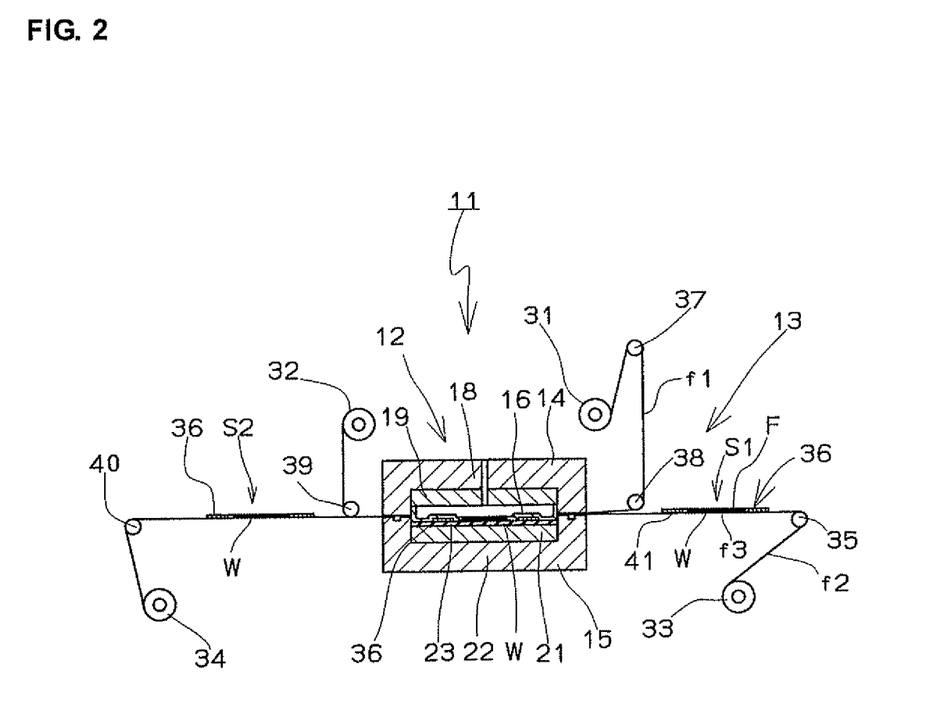
FIG. 2 is a diagram showing the lamination system when the vacuum chamber is closed and the semiconductor wafer is pressed by the elastic film member.

As shown in FIG. 1, the lamination device 12 includes an upper plate 14 and a lower plate 15 installed to face each other. The lower plate 15 may move upwards or downwards with respect to the upper plate 14, and when the upper plate 14 and the lower plate 15 are closed, a vacuum chamber C is formed between the upper plate 14 and the lower plate 15. The vacuum chamber C may be made vacuous by sucking by a vacuum pump, not shown. In addition, an elastic film member 16 is installed at the lower side of the upper plate 14 inside the vacuum chamber C. The elastic film member 16 is made of heat-resisting rubber such as a silicon rubber having hardness (Shore A hardness) of 10° to 65° (more preferably, 15° to 55°) and a thickness of 1 mm to 6 mm (more preferably, 2 mm to 5 mm), without being limited thereto. The rim of the elastic film member 16 is hooked and fixed to a base 18 of the upper plate 14 by a frame body 17 and bolts, not shown, and may be expanded into the vacuum chamber C during a pressing process. In addition, a fine unevenness is formed on the surface of the elastic film member 16. Moreover, in case of being laminated on a semiconductor wafer W having a bump formed at the surface thereof, the bump is provided toward the upper side, and the hardness of the elastic film member 16 of the upper plate 14 is preferably set higher than the hardness of the elastic fixing film member 23 of the lower plate 15.

In addition, a heat plate 19 which is a part of the upper plate is attached to the base 18 of the upper plate 14. A cartridge heater (not shown) is installed in the heat plate 19, or a rubber heater (not shown) is installed at the surface thereof, so that the heat plate 19 may generate heat. In addition, an absorbed/compressed air supply hole 20 is formed toward an opposite side of the elastic film member 16 through the base 18 of the upper plate 14 and the heat plate 19. An opening of the absorbed/compressed air supply hole 20 in the device is opened at the opposite side of the elastic film member 16, and an opening thereof out of the device is connected to a vacuum pump and a compression pump (not shown) installed out of the upper plate 14 by means of a valve or the like.

With respect to the lower plate 15, a heat plate 21 which is a part of the lower plate is also installed to a base 22 thereof. In addition, the elastic fixing film member 23 is also adhered to the upper surface of the heat plate 21 of the lower plate 15. The elastic fixing film member 23 is made of heat-resisting rubber such as a silicon rubber having hardness (Shore A hardness) of 10° to 60° and a thickness of 1 mm to 6 mm. In addition, a fine unevenness is formed on the surface of the elastic fixing film member 23. An absorbing hole 24 is formed at a part of the lower plate 15. In addition, an opening of the absorbing hole 24 inside the device is opened to the vacuum chamber C, and an opening thereof out of the device is connected to a vacuum pump (not shown). Moreover, a seal member such as an O-ring 26 is installed at a wall 25 around the lower plate 15, and when the vacuum chamber C is formed, the upper surface of the wall 25 of the lower plate 15 and the O-ring 26 are interposed between carrier films f1, f2, described later, or directly contact the lower surface of the frame body 17 of the upper plate 14. In addition, the vacuum chamber C is not limited to the above structure if it has appropriate width and height.

Next, the carrying mechanism 13 for the semiconductor wafer W and the film-type laminate F will be described. In the carrying mechanism 13, a carrier film f1 unwound from an unwinding roll 31 installed at the upper side near a preprocess of the lamination device 12 passes between the upper plate 14 and the lower plate 15 of the lamination device 12 and is wound around a winding roll 32 installed at the upper side near a post-process of the lamination device 12. In addition, a carrier film f2 unwound from an unwinding roll 33 installed at the lower side near the preprocess of the lamination device 12 passes between the upper plate 14 and the lower plate 15 of the lamination device 12 and is wound around a winding roll 34 installed at the lower side near the post-process of the lamination device. The carrier films f1, f2 are made of resin films such as polyethylene terephthalate, as known in the art.

The carrying mechanism 13 will be described in more detail. The lower carrier film f2 is unwound from the unwinding roll 33 and then changes its direction by a roller 35 to be sent in a horizontal direction toward the lamination device 12. In addition, a carrying-in stage S1 for carrying in the mount member 36 to which the semiconductor wafer W and the film-type laminate F are mounted is installed at a portion (a portion having an open upper side) where only the lower carrier film f2 is sent in the horizontal direction.

Meanwhile, the upper carrier film f1 also changes its direction by rollers 37, 38 to be sent to the lamination device 12 so that it overlaps with the lower carrier film f2 in front of the lamination device 12, instead of the carrying-in stage S1. In addition, in the post-process of the lamination device 12, after the upper carrier film f1 changes its direction toward the winding roll 32 by the roller 39, the lower carrier film f2 is also sent in the horizontal direction. In addition, a carrying-out stage S2 for carrying out the mount member 36 to which the laminated semiconductor wafer W is mounted is installed at a portion (a portion having an open upper side) where only the lower carrier film f2 is sent in the horizontal direction. After that, the lower carrier film f2 changes its direction by the roller 40 and is wound around the winding roll 34.

In addition, as another embodiment of the carrying mechanism 13, a gripping carrier device for gripping both ends of the carrier films f1, f2 between the lamination device 12 and the winding rolls 32, 34 by a chuck device and pulling the carrier films f1, f2 toward the post-process may also be installed. Further, a plurality of lamination devices may be installed, without being limited to a single device, and a press device may be added after the lamination device 12 using the elastic film member 16 which is expanded.

Moreover, as another embodiment of the carrying mechanism, in the mount member to which the semiconductor wafer W serving as a brittle lamination target and the film-type laminate F serving as a film-type laminate are mounted, a portion of the wafer ring 41 may be supported by a transfer device such as a multi-joint robot so that the mount member may be directly carried into or out of the lamination device 12. In this case, the mount member may be carried by interposing the wafer ring 41 by a grip unit of a robot, or the wafer ring 41 may be carried while being loaded on a support of the robot. In addition, interposing by the grip unit of the robot or loading on the support is included in the concept of supporting the semiconductor wafer W or the like. In addition, in another embodiment, the carrier film f2 is not used when carrying the semiconductor wafer W.

Figure 4:
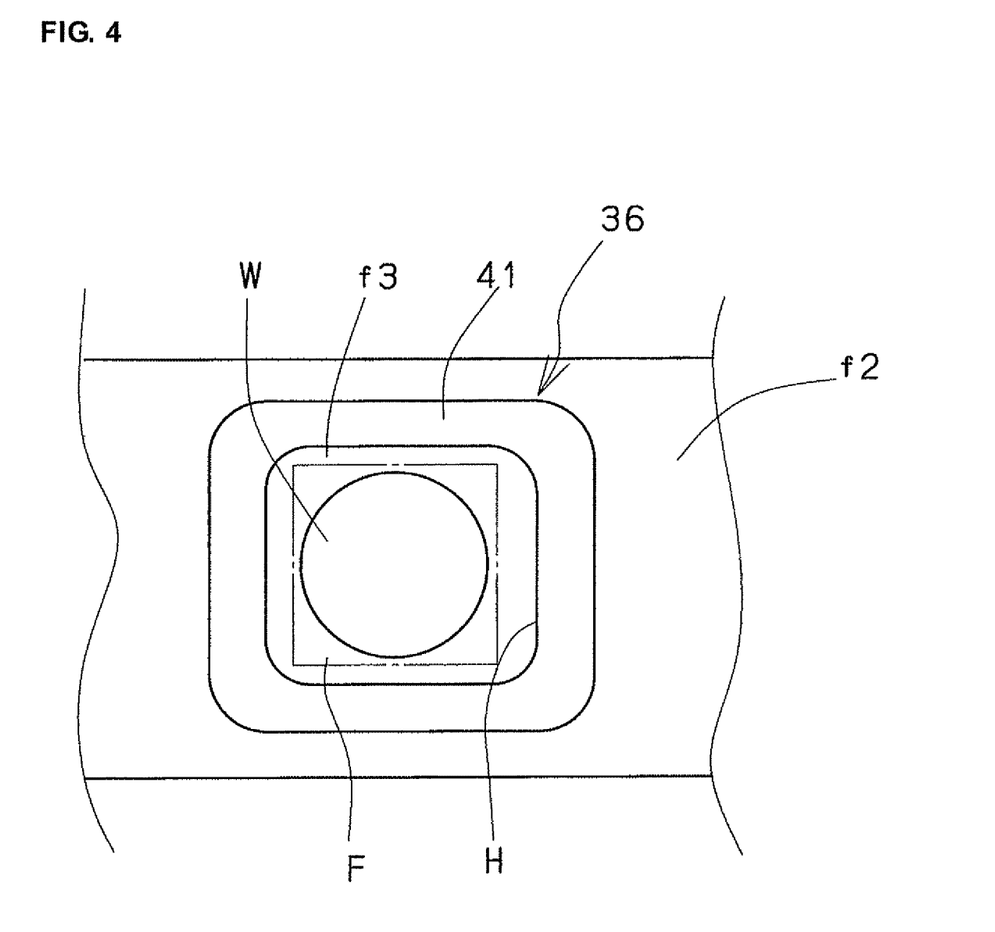
FIG. 4 is a plane view showing a semiconductor wafer and a film-type laminate, mounted on a mount member.
Figure 5:
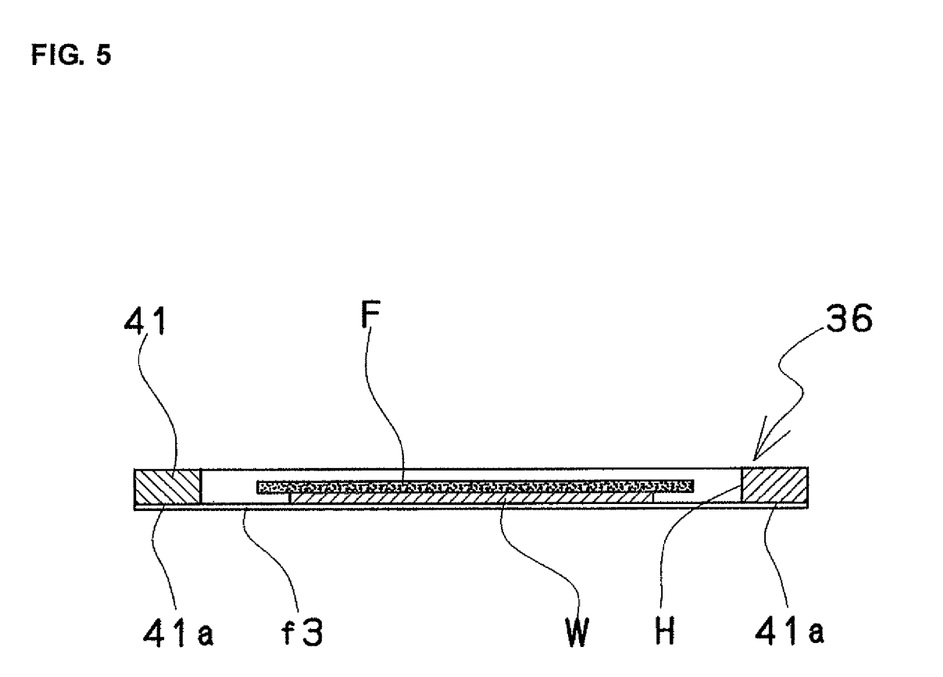
FIG. 5 is a cross-sectional view showing the semiconductor wafer and the film-type laminate, mounted on the mount member.

Next, the mount member 36 of the carrying mechanism 13 will be described with reference to FIGS. 4 and 5. The mount member 36 to which the semiconductor wafer W serving as a brittle lamination target and the film-type laminate F are mounted includes a rim-shaped wafer ring (rim portion) 41 and a dicing tape (adhesive tape) f3 adhered to the wafer ring 41. The wafer ring 41 is made of material such as heat-resisting resin or metal, and without being limited thereto, has an inside hole H with a thickness of 1 to 5 mm. The thickness of the wafer ring 41 is larger than the sum of thicknesses of the semiconductor wafer W and the film-type laminate F, needless to say. In addition, the inside hole H of the wafer ring 41 is installed to have a length larger than the diameter of the semiconductor wafer W so that the semiconductor wafer W does not directly contact. In addition, even though the outer circumference of the wafer ring 41 and the inner circumference of the inside hole H have a rectangular shape with arc-shaped corners in this embodiment, they are not limited thereto but may have various shapes such as polygonal shapes like a rectangle and an octagon, a circular shape, or an oval shape. In addition, as shown in FIG. 5, the dicing tape (the adhesive film) f3 is attached to the lower surface 41a of the wafer ring 41 (an opposite side of the wafer ring 41 in the case the semiconductor wafer W is mounted) to close the inside hole H.

Therefore, in the mount member 36, the adhesive layer of the dicing tape f3 is attached upwards, and the dicing tape f3 having an exposed adhesive layer is installed at the portion (the central portion) of the inside hole H of the wafer ring 41. In addition, a circular semiconductor wafer W is attached to the adhesive layer of the dicing tape f3, and a rectangular film-type laminate F overlaps thereon. The film-type laminate F is generally cut to a size capable of covering the entire surface of the semiconductor wafer W as described above. In addition, in the film-type laminate F, surrounding portions other than the portion contacting the upper surface of the semiconductor wafer W are installed to face the dicing tape f3. In this case, the film-type laminate F may be adhered to the dicing tape f3 or simple overlap therewith. In this configuration, the semiconductor wafer W and the film-type laminate F are fixed on the mount member 36 without being dislocated. In addition, the shape of the film-type laminate F is not limited to a rectangular shape but may have a circular shape or a continuous strip shape as described later.

Next, a lamination method using the lamination system 11 according to an embodiment will be described with reference to FIGS. 1 to 3. The brittle lamination target employed in the lamination method of this embodiment may be a wafer made of brittle material such as a silicon wafer having a thickness of 0.3 mm or less in case of a semiconductor, a compound semiconductor wafer of gallium nitride, or a wafer made of silicon nitride, without being limited thereto. In particular, in case of a semiconductor wafer W having a thickness of 0.01 mm to 0.1 mm, it is required to use the mount member 36 having the wafer ring 41 and the dicing tape f3. In addition, regarding the diameter of the semiconductor wafer W, for example, a semiconductor having a diameter of 100 mm to 500 mm is laminated, and then it tends to have a larger size, without being limited thereto. With the same thickness, the semiconductor wafer W may be easily broken as its diameter is greater. Such a brittle semiconductor wafer W may be more easily broken during being handled or laminated, in comparison to conventional wafers, and thus tends to deteriorate a yield. In other case, semiconductor wafers W having a thickness of 0.01 mm to 0.1 mm or semiconductor wafers W having a bump formed at the surface thereof may not be suitably pressed by a roll laminate in many cases. Therefore, the lamination device 12 pressing by the elastic film member 16 is particularly preferred. In addition, the film-type laminate laminated on the semiconductor wafer W employs a film having insulation and adhesion such as a non conductive film (NCF).

First, as shown in FIGS. 1 and 2, while the film-type laminate F is being laminated on the semiconductor wafer W in the lamination device 12, a set of the mount member 36 to which the semiconductor wafer W and the film-type laminate F as described above is carried into the carrying-in stage S1 on the carrier film f2. The carrying-in work at this time is performed using a handling robot, not shown. However, since the mount member is carried in by gripping only the portion of the wafer ring 41 by using a chuck of the robot, there is no problem with the semiconductor wafer W having a small thickness which is easily broken. In addition, the mount member 36 may be carried in by a worker hand, and in this case, the mount member may be carried in without contacting the semiconductor wafer W. Moreover, the mount member 36 or the like may be carried in from a belt conveyor of a preprocess to the lower carrier film f2 of the lamination system 11. In this case, the mount member 36 is not gripped but slid to transfer, but an impact during the transfer is not directly applied to the semiconductor wafer W.

In addition, the mount member 36 is carried out in the carrying-out stage S2 simultaneously. In case of carrying out the mount member 36, similar to the carrying-in work, the portion of the wafer ring 41 of the mount member 36 is gripped by a handling robot or a human hand without contacting the semiconductor wafer W. In other case, the mount member may be transferred to/from a belt conveyor of a post-process without being gripped.

Figure 3:
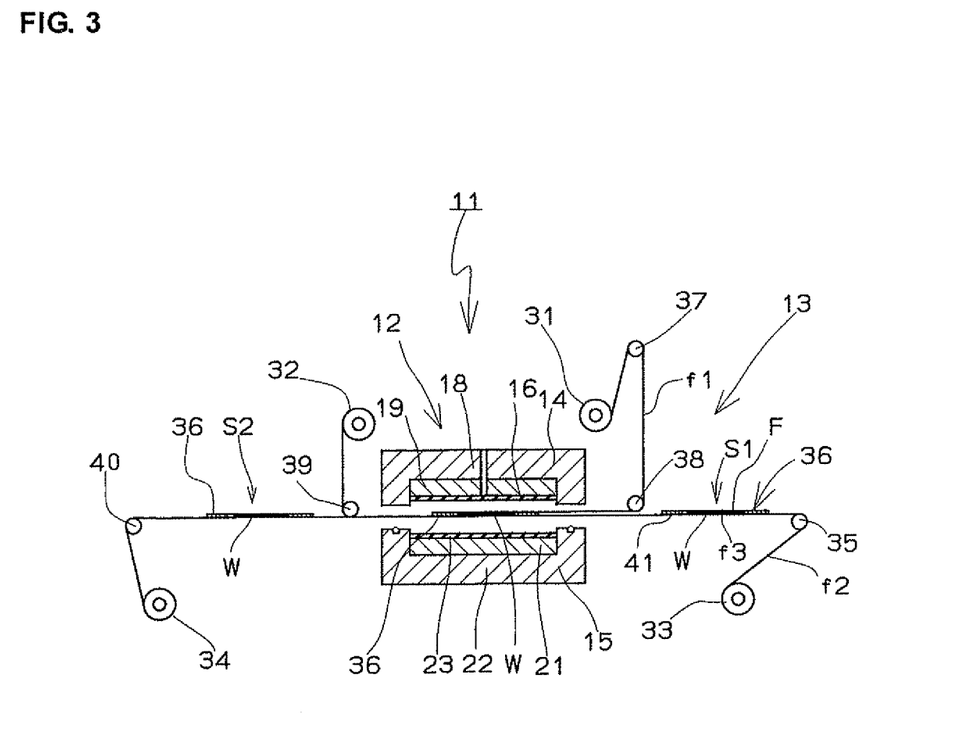
FIG. 3 is a diagram showing the lamination system when the vacuum chamber of the lamination device is opened.

Moreover, if the semiconductor wafer W is completely laminated in the lamination device 12 by spending a predetermined time, the atmospheric pressure in the vacuum chamber C returns to a normal pressure, and then, as shown in FIG. 3, the lower plate 15 moves downwards so that the upper plate 14 and the lower plate are opened. Next, in addition, the upper and lower winding rolls 32, 34 are operated to carry the carrier films f1, f2 from the preprocess toward the post-process. By doing so, the semiconductor wafer W and the mount member 36 which are completely laminated in a state of being interposed between the upper carrier film f1 and the lower carrier film f2 are moved from the inside of the lamination device 12 to the carrying-out stage S2. In addition, the semiconductor wafer W, the film-type laminate F and the mount member 36 on the lower carrier film f2 of the carrying-in stage S1 are simultaneously moved into the lamination device 12. At this time, the upper and lower carrier films f1, f2 are tension-controlled between the unwinding roll 31 and the winding roll 32 or between the unwinding roll 33 and the winding roll 34, so that the carrier films f1, f2 and the mount member 36 do not drop down between the upper and lower plates 14, 15 of the lamination device 12.

In addition, if the upper plate 14 and the lower plate 15 of the lamination device 12 are closed again, the vacuum chamber C is formed, and the vacuum chamber C is made vacuous by sucking through the absorbing hole 24 by a vacuum pump, not shown. At this time, since the heat plate 19 of the upper plate 14 and the heat plate 21 of the lower plate 15 are heated, the layer of the film-type laminate F toward the semiconductor wafer W or the entire film-type laminate F is melted. In addition, the heat plate 19 of the upper plate 14 and the heat plate 21 of the lower plate 15 are heated to, for example, 80° C. to 200° C., without being limited thereto. In this stage, preferably, the opposite side of the elastic film member 16 is absorbed by the vacuum pump but not pressed. In addition, if a predetermined time passes, as shown in FIGS. 1 and 2, a compressed air is introduced from a compression pump to the opposite side of the elastic film member 16 of the upper plate 14 through the absorbed/compressed air supply hole 20, so that the elastic film member 16 is expanded into the vacuum chamber C. By doing so, the film-type laminate F is elongated toward the upper surface of the semiconductor wafer W through the carrier film f1 by means of the elastic film member 16. In addition, the opposite side of the semiconductor wafer W is pressed toward the elastic fixing film member 23 adhered to the heat plate 21 of the lower plate 15 by the dicing tape f3 and the carrier film f2.

At this time, it is advantageous to expand the elastic film member 16 to press the upper surface of the semiconductor wafer W mounted on the mount member 36 due to the following reason. By pressing at the upper surface, the dicing tape f3 adhered to the lower surface of the wafer ring 41 of the mount member 36 is pressed to the elastic fixing film member 23 at the lower side, and at this time, the dicing tape f3 may not have substantially no bent or a small bent. Meanwhile, in the case an elastic film member is installed at the lower plate 15 and the elastic film member at the lower plate 15 is expanded, the dicing tape f3 is lifted up and bent greatly, and simultaneously the portion around the semiconductor wafer W is also bent and easily broken. In addition, the bent semiconductor wafer W may be easily broken due to the difference of shrinkage caused by air cooling. Moreover, the dicing tape f3 may also be easily torn. In addition, in case of pressing the elastic film member installed at the lower plate 15, the entire mount member 36 is lifted up by the expansion of the elastic film member, so that the mount member may deviate from the center of the vacuum chamber C of the lamination device 12. In this case, the semiconductor wafer W may stick out between the carrier films f1, f2 so that a part of the melted film-type laminate may be attached into the vacuum chamber C of the lamination device 12, irregularly pressed by the elastic film member, or cause a problem in handling to a post-process in the carrying-out stage S2.

In addition to the above, it may also be conceived that the film-type laminate such as a NCF film, the semiconductor wafer W, and the mount member 36 including the dicing tape f3 are mounted in order from the bottom and pressed from the below by the elastic film member. However, in this case, when the entire elastic film member is lifted up, the semiconductor wafer W may also be broken. In addition, there is a limit in carrying in or out the semiconductor wafer W, and when the semiconductor wafer W is attached to the dicing tape f3 of the mount member 36 or detached from the dicing tape f3 in a preprocess or a post-process, a process of, for example, reversing the mount member 36 is required.

When the film-type laminate such as a NCF film and the semiconductor wafer W are pressed by the lamination device 12, the pressure (the surface pressure applied to the semiconductor wafer W) may be, for example, in the range of 0.2 MPa to 1.0 MPa, without being limited thereto. In addition, the pressing time is, for example, 15 seconds to 90 seconds, without being limited thereto. Moreover, a predetermined time passes, the supply of compressed air to the opposite side of the elastic film member 16 is intercepted, and the elastic film member 16 is absorbed again toward the heat plate 19, consequently the laminating work is completed in the lamination device 12 by using the elastic film member 16. In addition, the vacuum chamber C is opened to the atmosphere to return to a normal pressure, and as shown in FIG. 3, the lower plate 15 is moved down again to open the vacuum chamber C. By repeating these procedures, the film-type laminates F are repeatedly laminated on the semiconductor wafers W by a batch-type lamination device 12. A surplus of the film-type laminate F remains in a completely laminated semiconductor wafer W, but the surplus is cut and removed on the carrier film f2 or in a post-process after the laminating process.

In addition, in the above embodiment, the film-type laminate F is adhered to the mount member 36 and carried together with the semiconductor wafer W. However, the film-type laminate F may also be a strip-type continuous film. If the film-type laminate F is a continuous film, in a state where a protective film or the like is wound from the unwinding roll of the film-type laminate F, the strip-like film-type laminate F overlaps on the semiconductor wafer W mounted on the mount member 36 and is supplied to the lamination device 12, and this is pressed in the lamination device 12 and then carried out. In a state where the semiconductor wafer W and the strip-like film-type laminate F laminated are mounted on the lower carrier film f2, a surplus of the film-type laminate F is cut from the laminated semiconductor wafer W.

In addition, in this embodiment, the film-type laminate F and the semiconductor wafer W are mounted on the mount member 36 and carried as being loaded on the carrier film f2. However, the semiconductor wafer W may also be directly carried in or out to a pressing position at the center of the lamination device 12 by supporting a portion of the wafer ring 41 by a grip unit of a multi-joint robot. In this case, during a pressing process by the lamination device 12, it should be considered that the film-type laminate F is melted and attached to the elastic film member 16 or the like. For this reason, it should also be considered that a protective film having the same size as an area contacting the upper surface of the wafer ring 41 is mounted on the film-type laminate F. The area of the protective film needs to be larger than the area of the film-type laminate F so that at least the film-type laminate F does not stick out, and preferably smaller than the area of the wafer ring 41. In addition, since the lower surface of the semiconductor wafer W is covered by the dicing tape f3, a protective film is not necessary. In addition, the laminating process is completed, the semiconductor wafer W is carried out of the lamination device 12 as the portion of the wafer ring 41 is gripped by a multi-joint robot. In this case, the semiconductor wafer W may be moved toward the same side as the carrying-in side by using a single robot, or the semiconductor wafer W may also be moved toward a certain direction by using two robots. Moreover, if a protective film overlaps therewith, the protective film is removed (or, a surplus of the film-type laminate F and the protective film may also be cut in advance).

Figure 6:
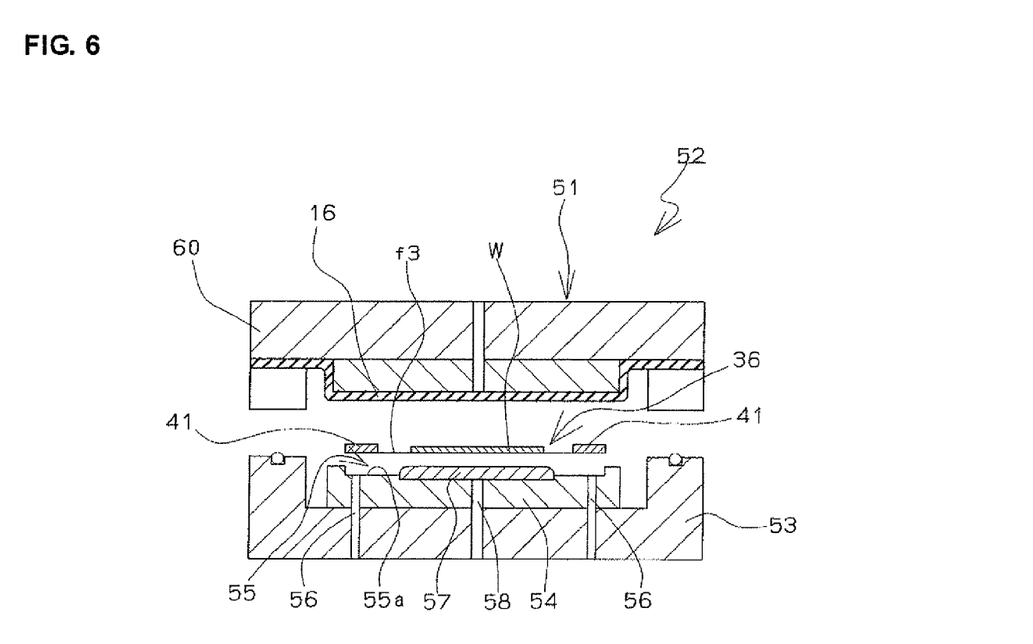
FIG. 6 is a diagram showing a lamination device of a lamination system according to another embodiment.

The case where the semiconductor wafer W is carried without using a carrier film will be described as a second embodiment. As shown in FIG. 6, since a basic structure of the lamination device 52 of the lamination system 51 is substantially identical to that of the lamination device 11 of the embodiment depicted in FIG. 1 or the like, only different components are endowed with reference symbols and described below. A concave portion 55 for mounting the wafer ring 41 is formed at the upper surface of the heat plate 54 (the mounting plate) of the lower plate 53 of the lamination device 52. In addition, an absorbing hole 56 is formed at the bottom 55a of the concave portion 55. Moreover, a mounting stand 57 of the semiconductor wafer W made of porous material is disposed at the center of the concave portion 55. The height of the mounting stand 57 is greater than the height of the bottom of the concave portion 55 and, for example, is identical to the upper surface of the outer side of the concave portion 55. However, on occasions, the height of the mounting stand 57 may be identical to the height of the bottom 55a. In addition, the opposite side of the mounting stand 57 is connected to a hole 58 formed for absorbing. The absorbing hole 56 and the hole 58 are respectively connected to a vacuum pump via a valve. In addition, the lamination system 51 includes a transfer device, not shown, which Includes a multi-joint robot for supporting and carrying the wafer ring 41 or a ring spacer 59, described later.

Figure 7:
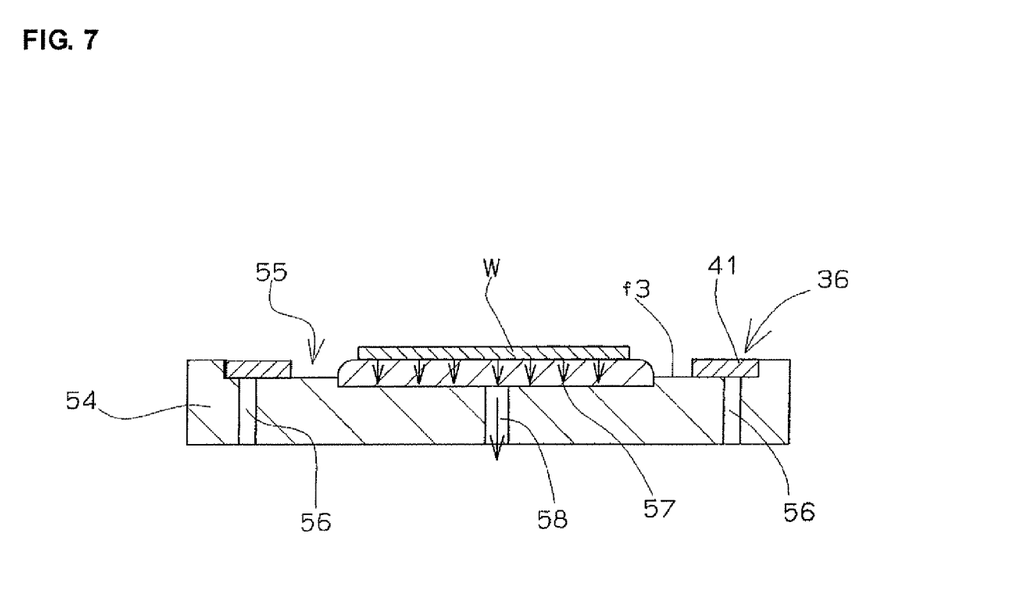
FIG. 7 is a diagram showing a laminating sequence of the lamination system according to another embodiment in a state where a semiconductor wafer W is mounted.

Next, a laminating method for laminating the semiconductor wafer W and the film-type laminate F by the lamination system 51 will be described with reference to FIGS. 6 to 10. First, as shown in FIGS. 6 and 7, since the wafer ring 41 is absorbed and supported by the transfer device, the semiconductor wafer W loaded on the mount member 36 is mounted in the concave portion 55 of the heat plate 54 of the lower plate 53 of the opened lamination device 52. With regard to the mount member 36, similar to the embodiment of FIG. 1 or the like, the dicing tape f3 is attached upwards to the wafer ring 41, and at an initial state, only the semiconductor wafer W is mounted on the dicing tape f3, and the film-type laminate F does not overlap therewith. In addition, if the semiconductor W loaded on the mount member 36 is mounted on the concave portion 55 of the heat plate 54, a portion of the dicing tape f3 at the opposite side of the semiconductor W is absorbed through the mounting stand 57 made of porous material from the absorbing hole 58. In addition, a portion of the wafer ring 41 is absorbed from the absorbing hole 56 through the dicing tape f3 and supported.

Figure 8:
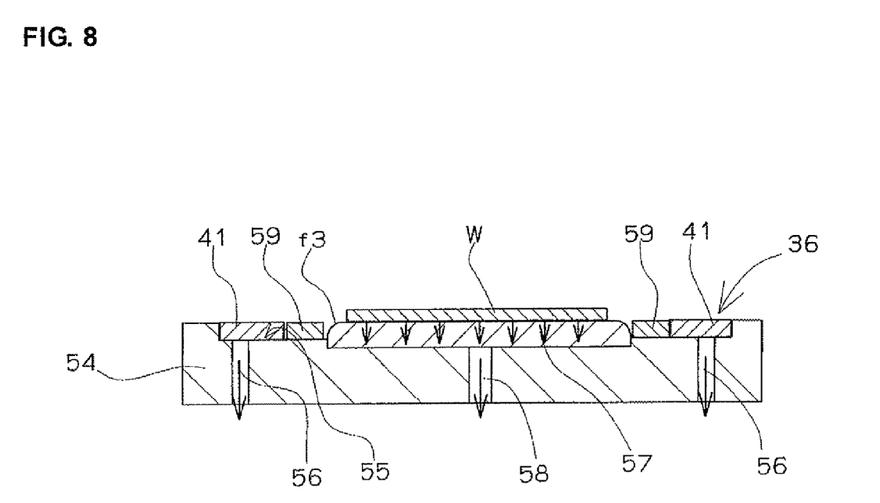
FIG. 8 is a diagram showing a laminating sequence of the lamination system according to another embodiment in a state where a ring spacer is mounted.

Next, as shown in FIG. 8, the ring spacer 59 is mounted on a portion between the semiconductor wafer W and the wafer ring 41 by the transfer device. The hole in the inner circumference of the ring spacer 59 may have a circular shape, and the outer side thereof may have a shape similar to the hole in the inner circumference of the wafer ring. The ring spacer 59 is mounted for the following purposes. When the elastic film member 16 is pressed down during the pressing process, it is possible to prevent the dicing tape f3 having an adhesive layer toward the above from being adhered to the elastic film member 16.

In addition, when the film-type laminate F is mounted, it is possible to prevent the film-type laminate F from contacting the dicing tape f3 and creating an inner space. The ring spacer 59 may also overlap with the mount member 36 together with the semiconductor wafer W from the first. In addition, it is not essential to install the ring spacer 59 depending on sizes of the semiconductor wafer W and the wafer ring 41.

Figure 9:
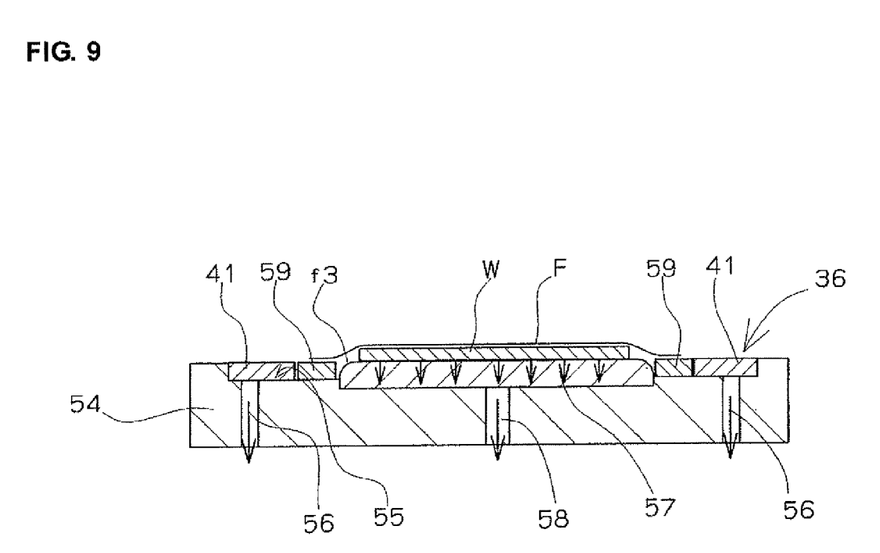
FIG. 9 is a diagram showing a laminating sequence of the lamination system according to another embodiment in a state where a film-type laminate is mounted.

Next, as shown in FIG. 9, the film-type laminate F (the NCF film) absorbed to another absorbing transfer unit of the transfer device is mounted on the semiconductor wafer W to cover the entire surface.

At this time, the region between the semiconductor wafer W and the ring spacer 59 is covered by the film-type laminate F, so that the dicing tape f3 does not expose. Next, the upper plate 60 and the lower plate 53 of the lamination device 52 are adhered to form a chamber therein, and the chamber is made vacuous by sucking.

Figure 10:
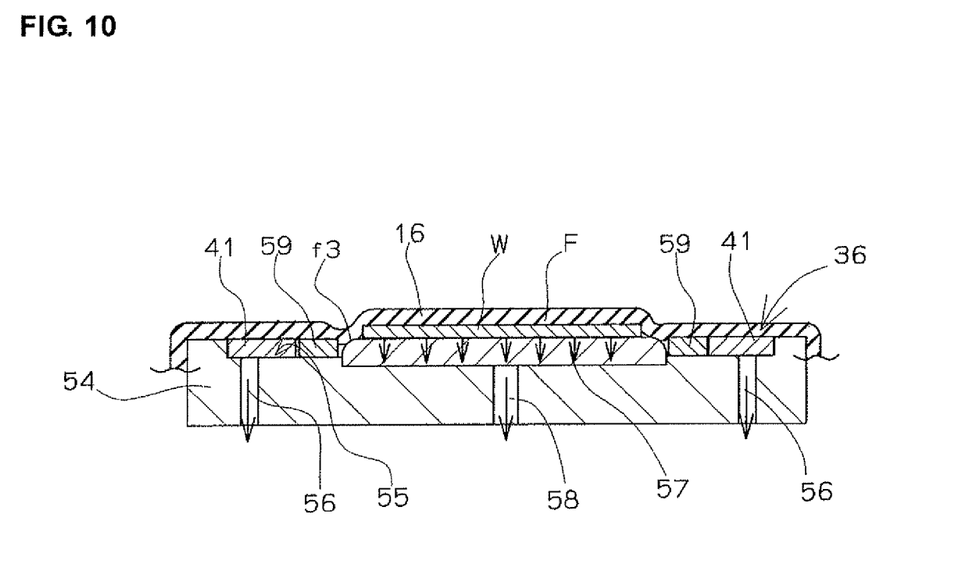
FIG. 10 is a diagram showing a laminating sequence of the lamination system according to another embodiment in a state where a semiconductor wafer and a film-type laminate are pressed by an elastic film member.

After that, as shown in FIG. 10, a compressed air is supplied to the opposite side of the elastic film member 16 installed at the upper plate 60 of the lamination device 52, and by the expanded elastic film member 16, the semiconductor wafer W is pressed through the film-type laminate F, thereby adhering and laminating them.

At this time, a tension is applied to the dicing tape f3 by the ring spacer 59, and the adhesion between the elastic film member 16 and the dicing tape f3 is prevented. If the laminating work is completed, the upper plate 60 and the lower plate 53 are opened, and only the ring spacer 59 is absorbed and removed by the transfer device. In addition, simultaneously or before or after this, a compressed air is supplied through the hole 58 and the mounting stand 57 made of porous material, so that the opposite side of the semiconductor wafer W is released. In addition, a compressed air is also supplied from the hole 56, and the upper surface of the wafer ring 41 is absorbed and taken off.

Moreover, in another embodiment, if the area between the semiconductor wafer W and the film-type laminate F may be made vacuous by sucking, from the beginning, a mount member 36 on which the semiconductor wafer W and the ring spacer 59 or the film-type laminate F are mounted may be carried in. In addition, in the lamination device 52 of this embodiment, the concave portion 55 may not be formed at the heat plate 54, but a positioning protrusion may be formed around the heat plate 54 to determine a position of the mount member 36. Moreover, as long as the lamination device 52 is capable of absorbing and supporting at least the mount member 36 to the lower plate 53, an elastic film member such as a silicon or rubber may be adhered to the upper surface of the heat plate 54 of the lower plate 53, and a portion of the semiconductor wafer W may be mounted thereon. In this case, portions other than the portion to which the semiconductor wafer W is mounted may be absorbed through a hole formed in the elastic film member or other members.

INDUSTRIAL AVAILABILITY

Though not described one by one in regard to the present invention, the present invention is not limited to the above embodiments but may be applied to modifications made by a person skilled in the art based on the spirit of the present invention, needless to say. The brittle lamination target employed in the lamination method and the lamination system of the present invention includes a wiring substrate having a plate thickness of 0.3 mm or less, a solar cell of 0.3 mm or less, a substrate (a green sheet) having a optical waveguide and ceramic before sintering regardless of a thickness, or the like, in addition to all semiconductor wafers having a plate thickness of 0.3 mm or less and nitride semiconductor wafers. In addition, regarding the plate thickness of the semiconductor wafer W, since a semiconductor wafer having a thickness of 0.01 mm to 0.05 mm may be easily broken while being handled, the present invention is very effective.

REFERENCE SYMBOLS

11: lamination system
12: lamination device
13: carrying mechanism
14: upper plate
15: lower plate
16: elastic film member
36: mount member
41: wafer ring (rim portion)
C: vacuum chamber
F: film-type laminate
H: inside hole
W: semiconductor wafer
f1, f2: carrier film
f3: dicing tape (adhesive tape)

The invention claimed is:

1. A lamination method for laminating an electrically insulating film-type laminate on a semiconductor wafer, the method comprising:
   mounting a mount member having the semiconductor wafer and the film-type laminate layered thereon in a vacuum chamber of a lamination device; and
   heating and pressing the semiconductor wafer and the film-type laminate in the vacuum chamber by expanding an elastic upper film member from above the film-type laminate using compressed air so as to sandwich the semiconductor wafer and the film-type laminate between the elastic upper film member and an elastic fixing film member,
   wherein:
      the mount member comprises a wafer ring having a rim shape and a dicing tape adhered to a lower surface of the wafer ring, the lower surface of the wafer ring being the surface that faces the elastic fixing film member and is opposite the elastic upper film member, and
      a thickness of the wafer ring is larger than the sum of thicknesses of the semiconductor wafer and the film-type laminate,
   the method further comprising:
      carrying the mount member, on which the semiconductor wafer on the dicing tape adhered to the lower surface of the wafer ring and the film-type laminate on the semiconductor wafer are mounted, into or out of the lamination device by supporting the wafer ring of the mount member, so as to press a lower side of the semiconductor wafer via the dicing tape toward the elastic fixing film member, the lower side being the side facing the elastic fixing film member and opposite the elastic upper film member.

2. A lamination method for laminating an electrically insulating film-type laminate on a semiconductor wafer, the method comprising:
   mounting a mount member having the semiconductor wafer and the film-type laminate layered thereon in a vacuum chamber of a lamination device;
   heating and pressing the semiconductor wafer and the film-type laminate in the vacuum chamber by expanding an elastic upper film member from above the film-type laminate using compressed air so as to sandwich the semiconductor wafer and the film-type laminate between the elastic upper film member and an elastic fixing film member, and so as to press a lower side of the semiconductor wafer via a dicing tape toward the elastic fixing film member, the lower side being the side facing the elastic fixing film member and opposite the elastic upper film member, wherein:

the mount member comprises a wafer ring having a rim shape and the dicing tape adhered to a lower surface of the wafer ring, the lower surface of the wafer ring being the surface that faces the elastic fixing film member and is opposite the elastic upper film member, and a thickness of the wafer ring is larger than the sum of thicknesses of the semiconductor wafer and the film-type laminate, the method further comprising:

carrying the mount member, on which the semiconductor wafer on the dicing tape adhered to the lower surface of the wafer ring and the film-type laminate on the semiconductor wafer are mounted, into or out of the lamination device by using a carrier film that is installed at the lower side and unwound from an unwinding roll and wound around a winding roll.

3. The lamination method according to claim 1, wherein the dicing tape is adhered to the lower surface of the wafer ring so as to close an inside hole of the wafer ring.

4. The lamination method according to claim 2, wherein the dicing tape is adhered to the lower surface of the wafer ring so as to close an inside hole of the wafer ring.

* * * * *